United States Patent [19]
Alfonso et al.

[11] Patent Number: 5,159,265
[45] Date of Patent: Oct. 27, 1992

[54] PIVOTABLE SPRING CONTACT

[75] Inventors: Juan O. Alfonso, Ft. Lauderdale; Peggy L. Clark, Plantation; Adolph C. Naujoks, Coral Springs; Ray D. Pearson, Sunrise, all of Fla.

[73] Assignee: Motorola, Inc., Schaumburg, Ill.

[21] Appl. No.: 762,185

[22] Filed: Sep. 19, 1991

[51] Int. Cl.⁵ .............................................. G01R 1/67
[52] U.S. Cl. ................................ 324/158 P; 324/72.5; 439/482
[58] Field of Search ............... 324/158 F, 158 P, 72.5; 439/700, 482, 824

[56] References Cited
U.S. PATENT DOCUMENTS

| 4,686,465 | 8/1987 | Krüger | 439/482 |
| 4,904,213 | 2/1990 | Hock et al. | 439/482 |

FOREIGN PATENT DOCUMENTS 025904  6/1988  Fed. Rep. of Germany ...... 439/482

OTHER PUBLICATIONS

Hallenbach; "Electrical Contacting Probe"; IBM Technical Disclosure Bulletin, vol. 9, No. 5; Oct. 1966.

Primary Examiner—Vinh Nguyen
Attorney, Agent, or Firm—Pablo Meles

[57] ABSTRACT

A pivotable spring probe (30) includes a housing (36) having an opening, a plunger (34) within and guided by the housing, the plunger being slidingly movable between an extended position and a retracted position, a pivotable contact head (32) mounted on the plunger for making electrical contact with a conductive surface external to the housing, and a spring (42) mounted on the bottom of the plunger for biasing the plunger towards the housing opening.

13 Claims, 3 Drawing Sheets

PIVOTABLE SPRING CONTACT

TECHNICAL FIELD

This invention relates generally to spring contacts and, more particularly, to a pivotable spring contact probe.

BACKGROUND

Spring contact probes are typically used for testing electronic components themselves or the components mounted on printed circuit boards (PCBs), flex circuits or substrates. The probes, preferably being retractable, are also used to test connectors, back planes and other circuitry where a number of points must be accessed. Referring to FIG. 1, there is shown a spring contact probe 10 having a contact head 12, a plunger 14, a housing or probe body 16, a plunger body 18, and a spring 22. Optionally, the probe 10 includes a crimp 20 on the housing to restrict the movement of the plunger 14 and plunger body 18. The spring 22 is preferably wedged in the closed area of the probe housing which optionally has a vent hole 24 at the bottom. This probe is sufficient for testing electronic products in low frequency applications when the surface being contacted is substantially flat and the test does not require a high degree of accuracy.

The spring contact probe 10 presents a problem when the contacting surface is curved and the test requires a high degree of accuracy. The introduction of Controlled Collapsible Chip Carrier Connections (C-5) on substrates illustrates the incompatibility of the spring contact probe 10 with the use of present contacting schemes. C-5 is a contacting scheme using solder spheres on a component that are reflowed onto the contact side of a surface mount package such as a chip carrier. The present design of spring contact probes as shown in FIG. 1 fails to conform to the spherical contour of the C-5 ball. A minor contact misalignment between the solder ball and the spring contact probe will cause a single load-bearing spot, which in turn causes an area of constriction resistance. The misalignment changes the coaxial geometry of a radio frequency (RF) transmission line and causes an increase in the characteristic impedance of the line. The impedance change due to the misalignment is uncontrolled and unpredictable and obviously degrades the accuracy and repeatability of RF tests and measurements. Thus, a need exists for a spring contact probe that will compensate for the misalignment of contact surfaces of electronic components in order to obtain better contact surfaces and more accurate and repeatable RF tests and measurements.

SUMMARY OF THE INVENTION

A pivotable spring probe comprises a housing having an opening, a plunger within and guided by the housing, the plunger being slidingly movable between an extended position and a retracted position, a pivotable contact head mounted on the plunger for making electrical contact with a conductive surface external to the housing, and a spring means mounted on the bottom of the plunger for biasing the plunger towards the housing opening.

DETAILED DESCRIPTION OF THE PREFERRED EMBODIMENT

Figure 1:
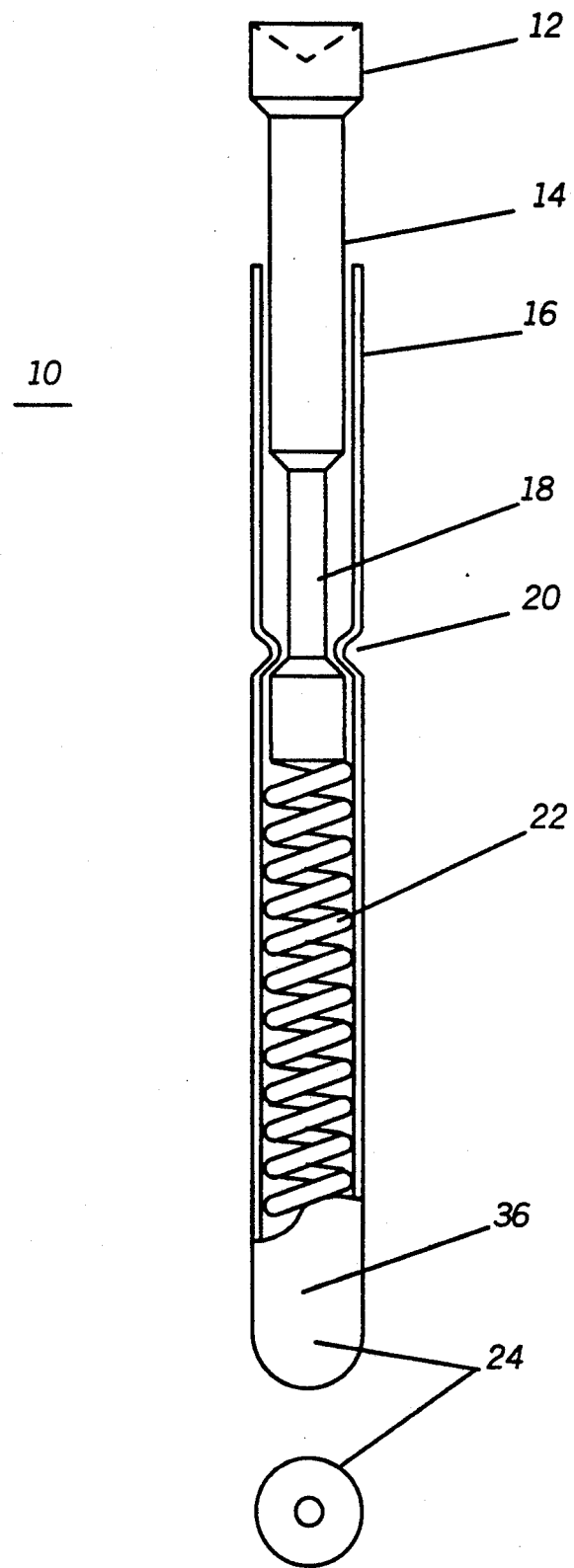
FIG. 1 is a side cut view of a spring contact probe as known in the art.
Figure 2:
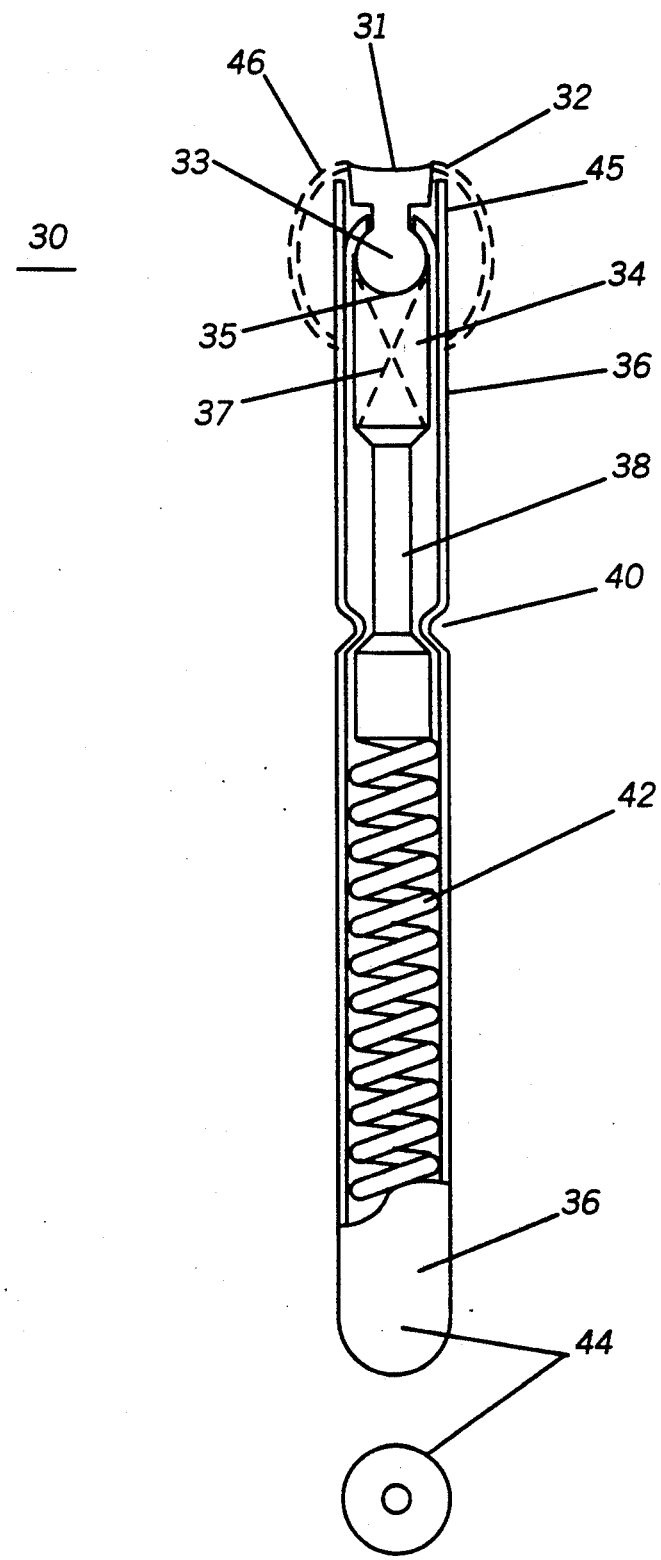
FIG. 2 is a side cut view of a spring contact probe in accordance with the present invention.

Referring to FIG. 2, there is shown a spring contact probe 30 in accordance with the present invention having a contact head 32, a plunger 34, a housing or probe body 36, a plunger body 38, and a spring means 42. Optionally, the probe 30 includes a crimp 40 on the housing to restrict the movement of the plunger 34 and plunger body 38. The spring means 42 is preferably a coiled spring wedged in the closed area of the probe housing which optionally has a vent hole 44 at the bottom. The contact head 32 preferably has a concave shape 31 having a diameter that would match the contact surface of the component (not shown). Furthermore, the pivotable contact head comprises a gold plated contact area. Preferably, the contact head is retainably mounted on the plunger. The plunger preferably has a semi-spherical void 35 for receiving a ball swivel head 33 that is integrally formed below the contact head 32. The ball swivel head 33 and the void 35 form a ball and socket joint that preferably allows the contact head to rotate approximately 5 degrees in any direction. Of course, the present invention could be designed to allow the contact head 32 a greater or smaller degree of freedom as required. Optionally, the spring contact probe 30 further comprises a self-aligning means (45 and 46) for retaining the contact head in a centrally disposed position. The self-aligning means preferably comprises a right leaf spring 45 and a left leaf spring 46 both attached to the probe body 36. The leaf springs 45 and 46 are mounted on opposing sides of the contact head 32 to retain the contact head 32 in a centrally disposed position. Alternatively, the self-aligning means could comprise of a spring 37 coupled to the ball swivel head 33 and wedged on the bottom of the plunger 34 to bias the contact head in a centrally disposed position. Of course, other embodiments of the self aligning means are within contemplation of the present invention.

Figure 3A:
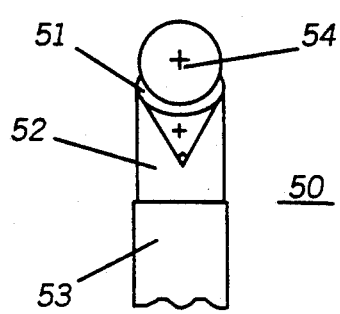
FIG. 3A and 3B are perspective views of contact probes as known in the art.
Figure 3B:
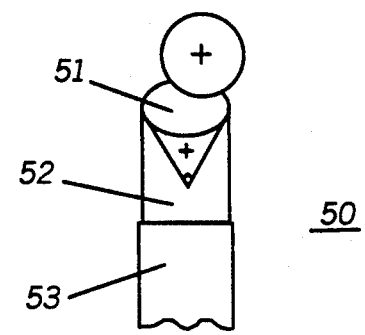
Figure 4:
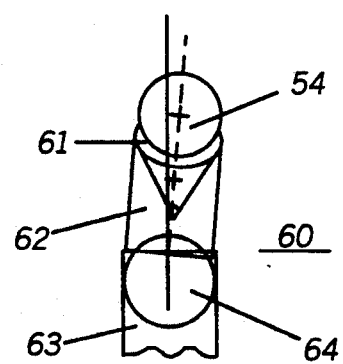
FIG. 4 is a perspective view of a contact probe in accordance with the present invention.

Referring to FIGS. 3A and 3B there is shown a contact spring 50 known in the art having a contact head 51, a plunger 52 and a probe body or housing 53. The contact spring 50 shown is particularly designed for use with testing C-5 type contacts or other contacts having substantially round spheres 54. FIG. 3A shows how the spherical contact 54 fits onto the contact head 51 when the contact 54 and the contact head 51 are aligned perfectly. FIG. 3B shows how the spherical contact 54 does not seat well with the contact head 51 when the contact 54 and the contact head 51 are misaligned. FIG. 4, by contrast, shows how an embodiment in accordance with the present invention would compensate for misaligned contacts.

Figure 5:
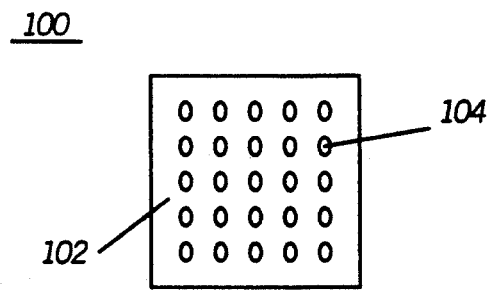
FIG. 5 is a top plan view of another aspect in accordance with the present invention.

The contact spring 60 preferably has a contact head 61, a plunger 62, a probe body or housing 63, and a pivoting means 64 such as a ball and socket joint. The contact spring 60 would articulate or rotate a small degree to provide a good contact surface between the contact spring and a spherical contact 54. Thus, referring to FIG. 5, a matrix or array 100 of spring contacts 104 on a board 102 could serve as a test fixture for an electronic component having a similar configuration. Each contact spring 104 would align as necessary to provide improved accuracy and repeatability of RF tests and measurements by reducing the unpredictable characteristic impedance due to misalignment.

What is claimed is:

1. A pivotable spring probe for probing a spherical surface, comprising:
    a housing having an opening;
    a plunger within and guided by said housing, said plunger being slidingly movable between an extended position and a retracted position;
    a pivotable contact head retainably mounted on said plunger for making electrical contact with a conductive surface external to said housing, said contact head having a concave shape for substantially mating with said spherical surface; and
    spring means mounted on the bottom of said plunger for biasing the plunger towards the housing opening.

2. The pivotable spring probe of claim 1, wherein said pivotable contact head comprises a gold plated contact.

3. The pivotable spring probe of claim 1, wherein said probe further comprises a self-aligning means for retaining the contact head in a centrally disposed position.

4. The pivotable spring probe of claim 3, wherein said self-aligning means comprises a spring coupled to the pivotable contact head.

5. The pivotable spring probe of claim 1, wherein said spring means comprises a coil spring coupled to a bottom portion of the plunger.

6. A pivotable spring contact probe for probing a conductive spherical surface, comprising:
    a cylindrical housing having an opening;
    a plunger within and guided by said housing, said plunger being slidingly movable between an extended position and a retracted position;
    a pivotable self-aligning contact head retainably mounted on said plunger for making electrical contact with said conductive spherical surface external to said housing, said contact head having a concave shape for substantially mating with said conductive spherical surface; and
    spring means mounted on the bottom of said plunger for biasing the plunger towards the housing opening.

7. The pivotable spring contact probe of claim 6, wherein said pivotable contact head comprises a gold plated contact.

8. The pivotable spring probe of claim 6, wherein said spring means comprises a coil spring coupled to a bottom portion of the plunger.

9. An electronic probing device for probing a plurality of conductive spherical surfaces, comprising:
    a plurality of pivotable spring probes formed in a predetermined pattern to couple to an electronic component having contacts formed in the predetermined pattern, each pivotable spring probe comprising:
    a housing having an opening;
    a plunger within and guided by said housing, said plunger being slidingly movable between an extended position and a retracted position;
    a pivotable contact head retainably mounted on said plunger for making electrical contact with a conductive surface external to said housing, said contact head having a concave shape for substantially mating with said conductive spherical surface; and
    spring means mounted on the bottom of said plunger for biasing the plunger towards the housing opening.

10. The pivotable spring probe of claim 9, wherein said pivotable contact head comprises a gold plated contact.

11. The pivotable spring probe of claim 9, wherein said probe further comprises a self-aligning means for retaining the contact head in a centrally disposed position.

12. The pivotable spring probe of claim 11, wherein said self-aligning means comprises a spring coupled to the pivotable contact head.

13. The pivotable spring probe of claim 9, wherein said spring means comprises a coil spring coupled to a bottom portion of the plunger.

* * * * *